(12) United States Patent
Hoshi

(10) Patent No.: US 9,252,098 B2
(45) Date of Patent: Feb. 2, 2016

(54) SEMICONDUCTOR APPARATUS HAVING POWER THROUGH HOLES CONNECTED TO POWER PATTERN

(75) Inventor: Sou Hoshi, Miura (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 13/504,462

(22) PCT Filed: Nov. 2, 2010

(86) PCT No.: PCT/JP2010/006472
§ 371 (c)(1),
(2), (4) Date: Apr. 26, 2012

(87) PCT Pub. No.: WO2011/058718
PCT Pub. Date: May 19, 2011

(65) Prior Publication Data
US 2012/0211897 A1 Aug. 23, 2012

(30) Foreign Application Priority Data

Nov. 11, 2009 (JP) .................................. 2009-258195
Oct. 26, 2010 (JP) .................................. 2010-240054

(51) Int. Cl.
| | |
|---|---|
| H01L 23/528 | (2006.01) |
| H01L 23/535 | (2006.01) |
| H01L 23/50 | (2006.01) |
| H01L 23/48 | (2006.01) |
| H01L 23/522 | (2006.01) |
| H01L 23/498 | (2006.01) |

(52) U.S. Cl.
CPC .............. *H01L 23/50* (2013.01); *H01L 23/481* (2013.01); *H01L 23/49822* (2013.01); *H01L 23/49844* (2013.01); *H01L 23/5226* (2013.01); *H01L 23/528* (2013.01); *H01L 23/535* (2013.01); *H01L 2924/0002* (2013.01); *H01L 2924/3011* (2013.01)

(58) Field of Classification Search
CPC ............ H01L 23/481; H01L 23/49822; H01L 23/49844; H01L 23/50; H01L 23/5226; H01L 23/528; H01L 23/535
USPC ........................... 257/691, E23.079, E23.153
See application file for complete search history.

(56) References Cited

U.S. PATENT DOCUMENTS

| | | | |
|---|---|---|---|
| 6,165,820 A | 12/2000 | Pace | |
| 6,479,758 B1 * | 11/2002 | Arima et al. | .................. 174/260 |
| 6,999,299 B2 | 2/2006 | Shimizu | |
| 7,075,185 B2 | 7/2006 | Nelson | |

(Continued)

FOREIGN PATENT DOCUMENTS

| | | |
|---|---|---|
| JP | 2006-237385 A | 9/2006 |
| JP | 2009-076721 A | 4/2009 |

*Primary Examiner* — Tom Thomas
*Assistant Examiner* — Christopher M Roland
(74) *Attorney, Agent, or Firm* — Canon USA, Inc. IP Division

(57) ABSTRACT

A semiconductor apparatus includes a multilayer interposer substrate including a power layer as an inner layer; a plurality of connection terminals provided on one surface of the interposer substrate; and a semiconductor chip mounted on the other surface of the interposer substrate. Among power terminals, ground terminals, and signal terminals provided in the semiconductor apparatus, all the power terminals are arranged in one power area and the power area includes only the power terminals.

8 Claims, 4 Drawing Sheets

(56) References Cited

U.S. PATENT DOCUMENTS

2003/0051910 A1  3/2003  Dyke
2006/0055049 A1  3/2006  Nelson
2008/0230889 A1  9/2008  Standing

* cited by examiner

FIG. 4A --PRIOR ART--
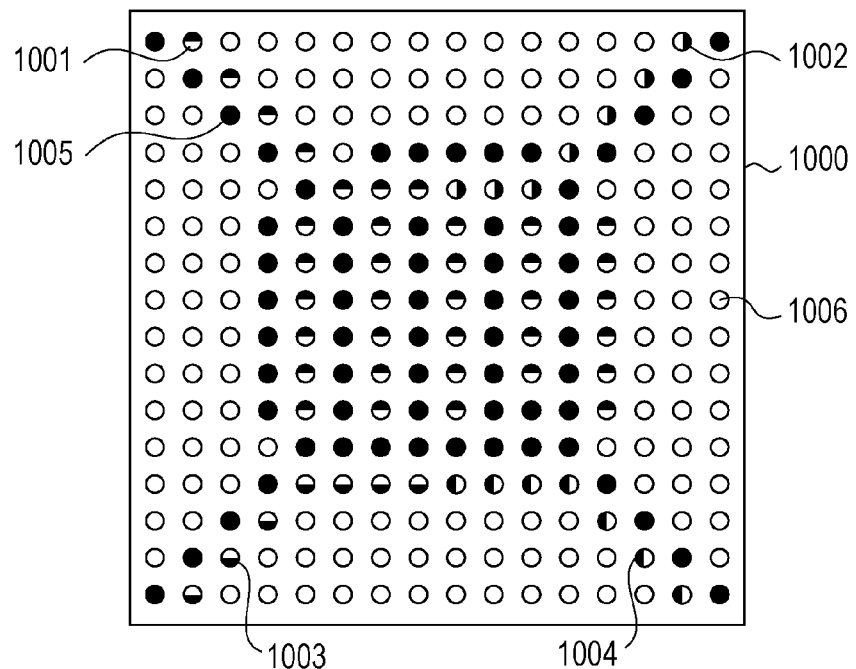
FIG. 4B --PRIOR ART--
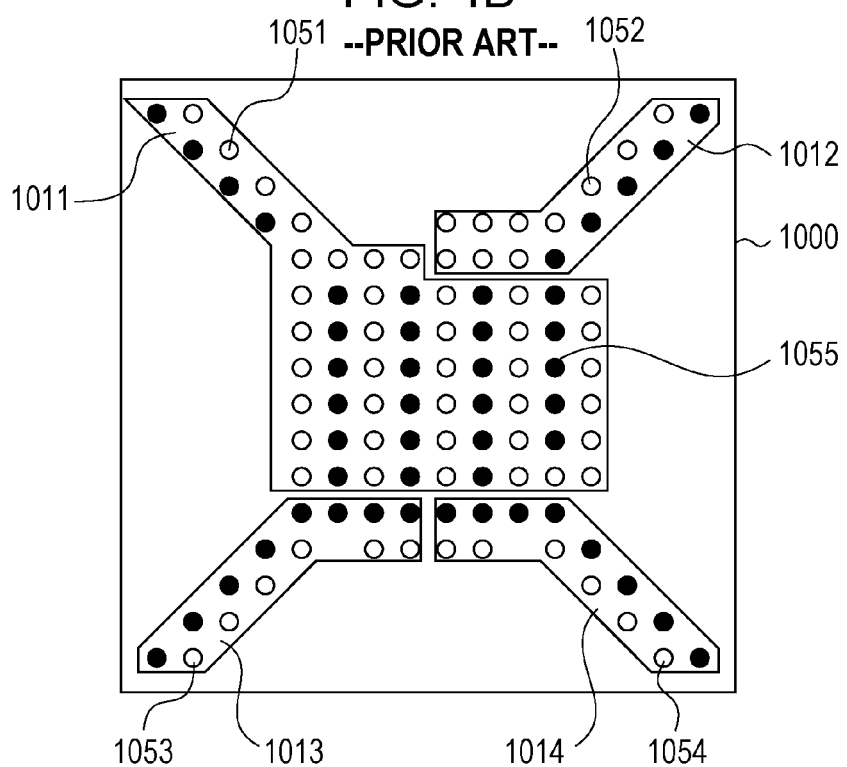

SEMICONDUCTOR APPARATUS HAVING POWER THROUGH HOLES CONNECTED TO POWER PATTERN

TECHNICAL FIELD

The present invention relates to the structure of a semiconductor apparatus having a semiconductor integrated circuit installed therein.

BACKGROUND ART

Semiconductor integrated circuits (hereinafter referred to as semiconductor chips) typified by application specific integrated circuits (ASICs) each include a core circuit that processes signals, an input-output circuit that inputs and outputs signals from and to an external circuit, a power supply, and a ground input circuit (GND input circuit). The power supply and the GND input circuit are used by the core circuit and the input-output circuit.

In a typical semiconductor apparatus, the semiconductor chip is installed in a member called a package. Mounting the package having the semiconductor chip installed therein on a print circuit board causes the signal input-output circuit, the power supply, and the GND input circuit in the semiconductor chip to be connected to the print circuit board.

There are many types of packages. When a semiconductor chip having 100 or more input-output terminals is used, for example, a ball grid array (BGA) package is often used. The package such as the BGA package includes a substrate called an interposer and the semiconductor chip is installed on the interposer. The interposer has signal, power, and GND patterns that are wired. The semiconductor chip is connected to the input-output terminals via the wiring.

Since multiple power supplies and multiple GND input circuits for the signal input-output and the core circuit exist in each semiconductor chip in recent years, multiple power patterns and multiple ground patterns exit on the interposer substrate. Accordingly, various measures have been heretofore adopted in order to stabilize the power supply and the grounding.

A method is known in which the power patterns are caused to oppose the GND patterns on the interposer substrate to produce capacitive components between the power patterns and the GND patterns in order to stabilize the power supply and the grounding. U.S. Pat. No. 6,999,299 discloses a technology in which a power plane is divided from a GND plane in the inner layer of the interposer substrate and the power terminals and the GND terminals are alternately arranged to ensure the capacitance.

The current consumption in the semiconductor chip is increased due to miniaturization of a semiconductor process to cause a problem of reduction in direct current (DC) voltage and/or electromigration. Accordingly, it is necessary to build a structure capable of keeping lower impedance and causing a large amount of current to flow by decreasing the resistances of the power patterns and the GND patterns in the semiconductor apparatus and the print circuit board.

In addition, the increase in the current consumption in the semiconductor chip promotes use of many power supplies in the semiconductor chip. For example, the power supply of the semiconductor chip is divided into multiple power supplies to stop some of the circuits during the operation or to supply lower voltage to circuits having lower operation frequencies. Consequently, the power patterns and the GND patterns in the semiconductor apparatus are required to have a structure that is easy to support the many power supplies in the semiconductor chip. However, many via holes for different voltages exist in the respective power and GND areas (for example, many GND via holes and many power via holes for different voltages exist in the power area) in the method in the related art, typified by the technology disclosed in U.S. Pat. No. 6,999,299, in which many via holes for the power supply and the grounding are closely arranged. Accordingly, the effective resistance is practically increased due to the many through holes even if the plane shape is adopted in order to reduce the resistance to prevent the impedance from being kept at a lower value.

CITATION LIST

Patent Literature

PTL 1: U.S. Pat. No. 6,999,299

SUMMARY OF INVENTION

The present invention provides a semiconductor apparatus that is capable of keeping lower resistance and lower impedance of power and GND patterns and that has large permissible current. The present invention also provides a semiconductor apparatus capable of easily forming the power and GND patterns supporting the semiconductor chip having many power supplies.

According to an embodiment of the present invention, a semiconductor apparatus includes a semiconductor chip mounted on an interposer substrate having multiple connection terminals provided thereon. The interposer substrate is a multilayer substrate including a power layer as an inner layer. The multiple connection terminals include power terminals, ground terminals, and signal terminals. The power terminals are arranged in one power area and the power area includes only the power terminals.

According to another embodiment of the present invention, a semiconductor apparatus includes a semiconductor chip mounted on an interposer substrate having multiple connection terminals provided thereon. The interposer substrate is a multilayer substrate including a power layer as an inner layer. The multiple connection terminals include at least two kinds of power terminals, ground terminals, and signal terminals. Among the power terminals, the power terminals of the same kind are arranged in the same power area and each power area includes only the power terminals of the same kind.

Further features of the present invention will become apparent from the following description of exemplary embodiments with reference to the attached drawings.

BRIEF DESCRIPTION OF DRAWINGS

FIG. 3C is a plan view of the respective layers of an interposer substrate of a semiconductor apparatus according to a second embodiment of the present invention.

FIG. 3D is a plan view of the respective layers of an interposer substrate of a semiconductor apparatus according to a second embodiment of the present invention.

FIG. 4A is a plan view of a connection terminal face of a semiconductor apparatus in related art.

FIG. 4B is a plan view of a power layer of the semiconductor apparatus in the related art.

DESCRIPTION OF EMBODIMENTS

Embodiments of the present invention will herein be described with reference to the attached drawings.

First Embodiment

Figure 1:
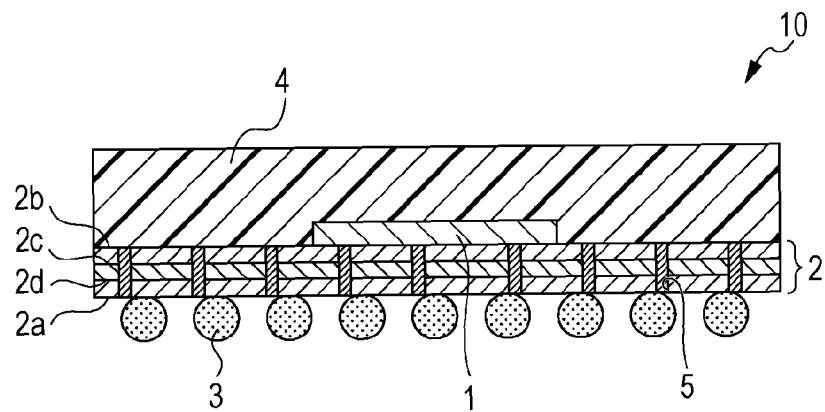
FIG. 1 is a cross-sectional view of a semiconductor apparatus according to a first embodiment of the present invention.

A first embodiment of the present invention will now be described with reference to FIG. 1 and FIGS. 2A to 2D. FIG. 1 is a cross-sectional view of a semiconductor apparatus according to the first embodiment of the present invention. Referring to FIG. 1, a semiconductor apparatus 10 includes a semiconductor chip 1, an interposer substrate 2, connection terminals 3, and sealing resin 4. The interposer substrate 2 is a multilayer substrate that includes a connection terminal face 2a and a semiconductor chip mounting face 2b as surface layers and a power layer 2c and a ground (GND) layer 2d as inner layers. The semiconductor chip 1 is connected to a power pattern, a GND pattern, and a signal pattern (not shown) formed on the semiconductor chip mounting face 2b. The power pattern, the GND pattern, and the signal pattern are led to the connection terminal face 2a through through holes 5 to be connected to the corresponding connection terminals 3. One kind of power source is used in the semiconductor apparatus 10 in FIG. 1. The arrangement order of the power layer 2c and the GND layer 2d may be reversed.

Figure 2A:
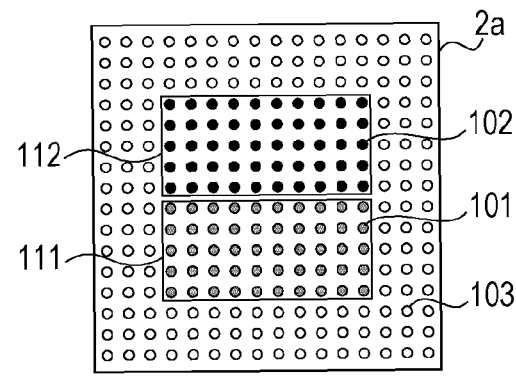
FIG. 2A is a plan view of the respective layers of an interposer substrate of the semiconductor apparatus according to the first embodiment of the present invention.

FIG. 2A is a plan view of the connection terminal face 2a of the semiconductor apparatus 10. Referring to FIG. 2A, the connection terminal face 2a has power terminals 101 through which power is supplied to the semiconductor chip 1, ground terminals (GND terminals) 102 through which the semiconductor chip 1 is grounded, and signal terminals 103 through which various signals are supplied to the semiconductor chip 1. All the power terminals 101 are arranged in a power area 111 and the power area 111 includes only the power terminals 101. All the GND terminals 102 are arranged in a ground area (GND area) 112 and the GND area 112 includes only the GND terminals 102.

Figure 2B:
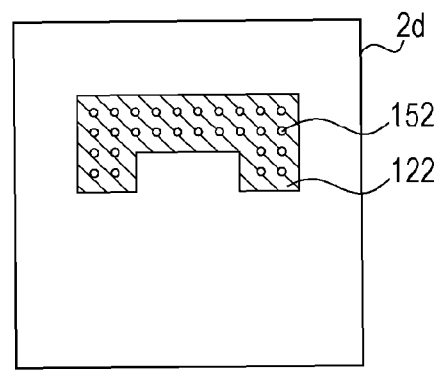
FIG. 2B is a plan view of the respective layers of an interposer substrate of the semiconductor apparatus according to the first embodiment of the present invention.

FIG. 2B is a plan view of the GND layer 2d of the semiconductor apparatus 10. Referring to FIG. 2B, the GND layer 2d has a GND pattern 122 formed thereon, which is connected to the GND terminals 102 and a GND pattern 132 described below via through holes 152. Power through holes and signal through holes other than the through holes 152 are not illustrated in FIG. 2B for convenience.

Figure 2C:
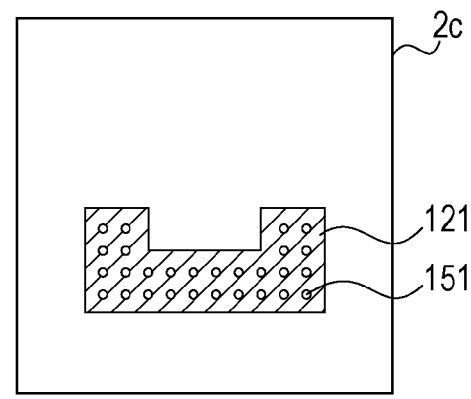
FIG. 2C is a plan view of the respective layers of an interposer substrate of the semiconductor apparatus according to the first embodiment of the present invention.

FIG. 2C is a plan view of the power layer 2c of the semiconductor apparatus 10. Referring to FIG. 2C, the power layer 2c has a power pattern 121 formed thereon, which is connected to the power terminals 101 and a power pattern 131 described below via through holes 151. GND through holes and signal through holes other than the through holes 151 are not illustrated in FIG. 2C for convenience.

Figure 2D:
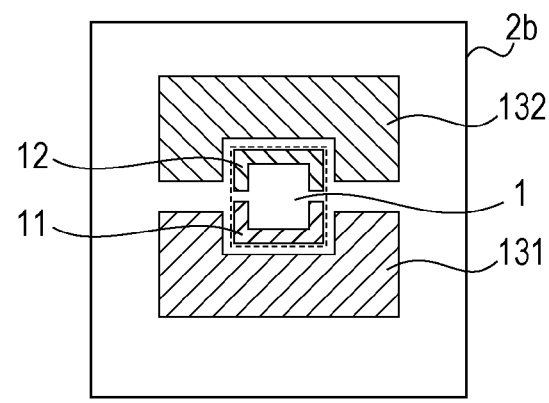
FIG. 2D is a plan view of the respective layers of an interposer substrate of the semiconductor apparatus according to the first embodiment of the present invention.

FIG. 2D is a plane view of the semiconductor chip mounting face 2b of the semiconductor apparatus 10. The semiconductor chip 1 is represented by using a dotted line and the through holes are not illustrated in FIG. 2D for convenience. Referring to FIG. 2D, the semiconductor chip mounting face 2b has the power pattern 131, a connection power pattern 11, the GND pattern 132, and a GND power pattern 12 formed thereon. The power pattern 131 is connected to the power terminals 101 and the power pattern 121 via the through holes 151. The connection power pattern 11 is provided in the semiconductor chip 1 and is connected to the power pattern 131 by wire bonding (not shown). The GND pattern 132 is connected to the GND terminals 102 and the GND pattern 122 via the through holes 152. The GND power pattern 12 is provided in the semiconductor chip 1 and is connected to the GND pattern 132 by the wire bonding (not shown).

In the first embodiment described above, the GND through holes and the signal through holes are not formed in the power pattern 121. Accordingly, since the resistance of the power pattern 121 can be decreased and the impedance thereof can be kept at a lower value, it is possible to stably supply the power even if a large amount of current flows through the power pattern 121. In addition, the power through holes and the signal through holes are not formed in the GND pattern 122. Accordingly, since the resistance of the GND pattern 122 can be decreased and the impedance thereof can be kept at a lower value, it is possible to be stably grounded even if a large amount of current flows through the GND pattern 122.

It is preferred that a bypass capacitor (not shown) be arranged in a boundary between the power area 111 and the GND area 112 in the first embodiment. Although the power terminals 101 and the GND terminals 102 are collected in the power area 111 and the GND area 112, respectively, the GND terminals 102 are not necessarily included in one GND area 112 and the GND terminals 102 may be dispersed in multiple areas.

Second Embodiment

A second embodiment of the present invention will now be described with reference to FIGS. 3A to 3D. Since the cross-sectional view of a semiconductor apparatus used in the second embodiment is the same as that of the semiconductor apparatus 10 in the first embodiment, the same reference numerals as those in the first embodiment are used in the second embodiment. The second embodiment differs from the first embodiment in the shapes of the connection terminal face 2a and the semiconductor chip mounting face 2b of the interposer substrate 2. Four kinds of power supplies are used in the semiconductor apparatus in the second embodiment.

Figure 3A:
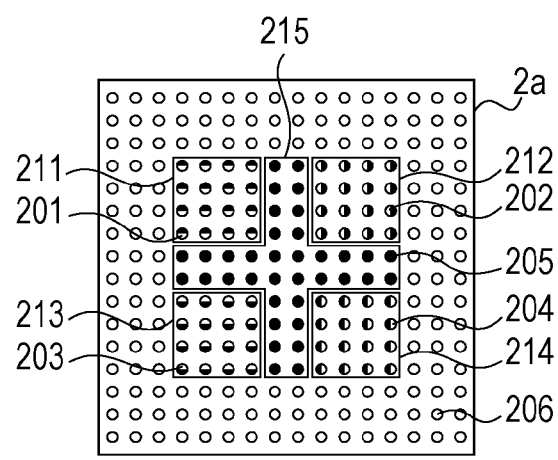
FIG. 3A is a plan view of the respective layers of an interposer substrate of a semiconductor apparatus according to a second embodiment of the present invention.

FIG. 3A is a plan view of the connection terminal face 2a of the semiconductor apparatus 10. Referring to FIG. 3A, the connection terminal face 2a has first power terminals 201 through which power is supplied to the semiconductor chip 1, second power erminals 202, third power terminals 203, four power terminals 204, GND terminals 205 through which the semiconductor chip 1 is grounded, and signal terminals 206 through which various signals are supplied to the semiconductor chip 1.

All the first power terminals 201 are arranged in a first power area 211 and the first power area 211 includes only the first power terminals 201. Similarly, the second power terminals 202 are arranged in a second power area 212 and the second power area 212 includes only the second power terminals 202. The third power terminals 203 are arranged in a third power area 213 and the third power area 213 includes only the third power terminals 203. The four power terminals 204 are arranged in a fourth power area 214 and the fourth power area 214 includes only the four power terminals 204.

All the GND terminals 205 are arranged in a GND area 215 and the GND area 215 includes only the GND terminals 205. The GND area 215 is formed so as to be adjacent to all of the first power area 211, the second power area 212, the third power area 213, and the fourth power area 214. The GND area 215 is formed in a plus shape in FIG. 3A.

Figure 3B:
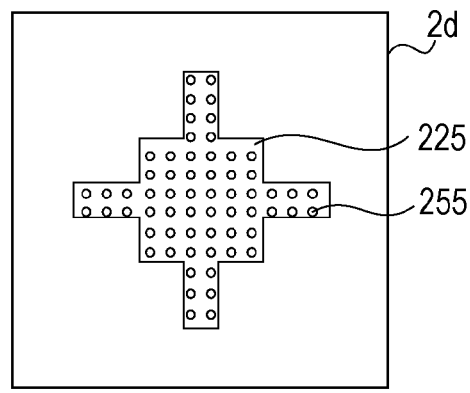
FIG. 3B is a plan view of the respective layers of an interposer substrate of a semiconductor apparatus according to a second embodiment of the present invention.
Figure 3B:
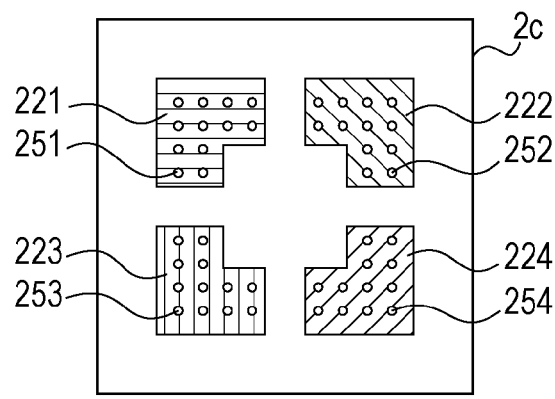
Figure 3B:
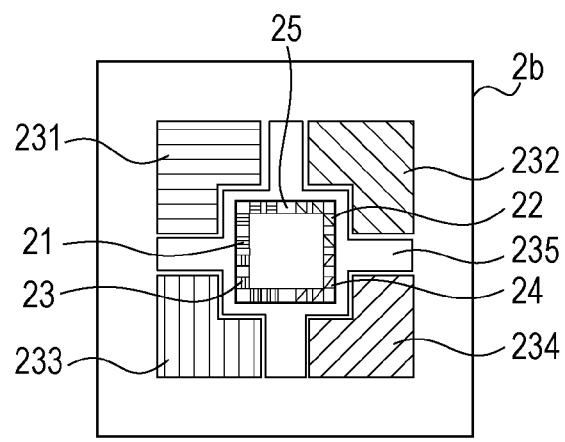

FIG. 3B is a plan view of the GND layer 2d of the semiconductor apparatus 10. Referring to FIG. 3B, the GND layer 2d has a GND pattern 225, which is connected to the GND terminals 205 and a GND pattern 235 described below via through holes 255. Power through holes and signal through holes other than the through holes 255 are not illustrated in FIG. 3B for convenience.

FIG. 3C is a plan view of the power layer 2c of the semiconductor apparatus 10. Referring to FIG. 3C, the power layer 2c has a first power pattern 221, a second power pattern 222, a third power pattern 223, and a fourth power pattern 224. The first power pattern 221 is connected to the first power terminals 201 and a first power pattern 231 described below via through holes 251. The second power pattern 222 is connected to the second power terminals 202 and a second power pattern 232 described below via through holes 252. The third power pattern 223 is connected to the third power terminals 203 and a third power pattern 233 described below via through holes 253. The fourth power pattern 224 is connected to the four power terminals 204 and a fourth power pattern 234 described below via through holes 254. GND through holes and signal through holes other than the through holes 252, 252, 253, and 254 are not illustrated in FIG. 3C for convenience.

FIG. 3D is a plan view of the semiconductor chip mounting face 2b of the semiconductor apparatus 10. The semiconductor chip 1 is represented by using a dotted line and the through holes are not illustrated in FIG. 3D for convenience. Referring to FIG. 3D, reference numeral 231 denotes the first power pattern on the semiconductor chip mounting face 2b and is connected to the first power terminals 201 and the first power pattern 221 via the through holes 251 described above. Reference numeral 21 denotes a first connection power pattern provided in the semiconductor chip 1 and is connected to the first power pattern 231 by wire bonding (not shown).

Reference numeral 232 denotes the second power pattern on the semiconductor chip mounting face 2b and is connected to the second power terminals 202 and the second power pattern 222 via the through holes 252 described above. Reference numeral 22 denotes a second connection power pattern provided in the semiconductor chip 1 and is connected to the second power pattern 232 by the wire bonding (not shown). Reference numeral 233 denotes the third power pattern on the semiconductor chip mounting face 2b and is connected to the third power terminals 203 and the third power pattern 223 via the through holes 253 described above. Reference numeral 23 denotes a third connection power pattern provided in the semiconductor chip 1 and is connected to the third power pattern 233 by the wire bonding (not shown). Reference numeral 234 denotes the fourth power pattern on the semiconductor chip mounting face 2b and is connected to the four power terminals 204 and the fourth power pattern 224 via the through holes 254 described above. Reference numeral 24 denotes a fourth connection power pattern provided in the semiconductor chip 1 and is connected to the fourth power pattern 234 by the wire boding (not shown).

Reference numeral 235 denotes the GND pattern on the semiconductor chip mounting face 2b and is connected to the GND terminals 205 and the GND pattern 225 via the through holes 255 described above. Reference numeral 25 denotes a GND power pattern provided in the semiconductor chip 1 and is connected to the GND pattern 235 by the wire bonding (not shown).

In the second embodiment described above, other power through holes, GND through holes, and signal through holes are not formed in the first power pattern 221, the second power pattern 222, the third power pattern 223, and the fourth power pattern 224. Accordingly, since the resistances of the first to fourth power patterns 221 to 224 can be decreased and the impedances thereof can be kept at lower values, it is possible to stably supply the power even if a large amount of current flows through the first to fourth power patterns 221 to 224.

In addition, the power through holes and the signal through holes are not formed in the GND pattern 225. Accordingly, since the resistance of the GND pattern 225 can be decreased and the impedance thereof can be kept at a lower value, it is possible to be stably grounded even if a large amount of current flows through the GND pattern 225.

It is preferred that a bypass capacitor (not shown) be arranged in a boundary between the first to fourth power areas 211 to 214 and the GND area 215 in the second embodiment. The GND terminals 205 are not necessarily included in one GND area 215 and the GND terminals 205 may be dispersed in multiple areas.

Although the through holes are formed for all the power terminals in the second embodiment, it is not necessarily establish the one-to-one correspondence between the power terminals and the through holes. The number of the through holes can be varied depending on the design. A smaller number of through holes allows the area of the power patterns to be expanded to more stably supply the power.

The through holes are not necessarily essential and non-through via holes may be used depending on the design. The use of the non-through via holes allows the area of the power patterns to be expanded to more stably supply the power.

Instead of the wire bonding semiconductor chip, a flip-flop semiconductor chip may be used. The use of the wire bonding semiconductor chip allows the area of the power patterns to be further expanded to more stably supply the power.

Although the case in which four kinds of power supplies are used is described in the second embodiment, the present invention is not limited to this case. A similar method can be used to support at least two kinds of power supplies. For example, the power supplies having different voltages or the power supplies that have the same voltage but are separated from each other due to noise interference or the like (for example, analog power supplies and digital power supplies) may be used.

COMPARATIVE EXAMPLE

A comparative example of the present invention will now be described with reference to FIGS. 4A and 4B. Since the cross-sectional view of a semiconductor apparatus used in the comparative example is the same as that of the semiconductor apparatus 10 in the first embodiment, the same reference numerals as those in the first embodiment are used in the comparative example. Four kinds of power supplies are used in the semiconductor apparatus in the comparative example.

FIG. 4A is a plan view of the connection terminal face 2a of a semiconductor apparatus 1000. The semiconductor apparatus 1000 has first power terminals 1001 through which power is supplied to the semiconductor chip 1, second power terminals 1002, third power terminals 1003, fourth power terminals 1004, GND terminals 1005 through which the semiconductor chip 1 is grounded, and signal terminals 1006 through which various signals are supplied to the semiconductor chip 1. Since the power terminals are normally close to the GND terminals in the related art, the respective power terminals and the GND terminals are alternately arranged.

FIG. 4B is a plan view of the power layer 2c of the semiconductor apparatus 1000. The power layer 2c has a first power pattern 1011, a second power pattern 1012, a third power pattern 1013, a fourth power pattern 1014, through holes 1051, through holes 1052, through holes 1053, through holes 1054, and GND through holes 1055. The first power pattern 1011 is connected to the first power terminals 1001 and the semiconductor apparatus 1000 via the through holes 1051. The second power pattern 1012 is connected to the second power terminals 1002 and the semiconductor apparatus 1000 via the through holes 1052. The third power pattern 1013 is connected to the third power terminals 1003 and the semiconductor apparatus 1000 via the through holes 1053. The fourth power pattern 1014 is connected to the fourth power terminals 1004 and the semiconductor apparatus 1000 via the through holes 1054. GND through holes and signal through holes formed in the areas other than the first to fourth power patterns 1011 to 1014 are not illustrated in FIG. 4B for convenience.

Since the power terminals are arranged closely to the GND terminals in the semiconductor apparatus in the related art, as shown in FIGS. 4A and 4B, many holes including other power through holes, the GND through holes 1055, and other signal through holes exit in the semiconductor apparatus. As a result, the effective resistance of the power structure is increased and the amount of permissible current is decreased despite the fact that a larger area is allocated to the power structure in order to keep the impedance at a lower value.

Since the power through holes having different voltages, the GND through holes, and the signal through holes do not exit in the power planes having the same voltage in the interposer substrate in the embodiments of the present invention, the area of the power structure can be increased. Consequently, it is possible to lower the resistance of the power structure and to increase the amount of permissible current.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-258195 filed Nov. 11, 2009 and No. 2010-240054 filed Oct. 26, 2010, which are hereby incorporated by reference herein in their entirety.

The invention claimed is:

1. A semiconductor apparatus comprising:
a multilayer interposer substrate having a connection terminal surface on one side and a chip mounting surface on another side, the interposer substrate including a power layer as an inner layer;
a plurality of connection terminals provided on the connection terminal surface; and
a semiconductor chip mounted on the chip mounting surface,
wherein the plurality of connection terminals include power terminals, ground terminals, and signal terminals,
wherein the power terminals are connected to a power pattern on the power layer and the semiconductor chip via power through holes,
wherein the ground terminals are connected to the semiconductor chip via ground through holes,
wherein the signal terminals are connected to the semiconductor chip via signal through holes,
wherein the power, ground, and signal through holes go through the interposer substrate from the connection terminal surface to the chip mounting surface,
wherein the ground and signal through holes are not formed in the power pattern on the power layer, and
wherein the power pattern defines an area that surrounds only the power through holes.

2. The semiconductor apparatus according to claim 1, wherein a ground layer is further provided as an inner layer of the interposer substrate, the ground terminals are connected to a ground pattern provided on the ground layer and the semiconductor chip via the ground through holes, and the ground pattern defines an area that surrounds only the ground through holes.

3. The semiconductor apparatus according to claim 2, wherein the ground pattern is arranged so as to be adjacent to the power pattern.

4. The semiconductor apparatus according to claim 1, wherein the power through holes, the ground through holes and the signal through holes are through holes which pass through a multilayer interposer surface.

5. A semiconductor apparatus comprising:
a multilayer interposer substrate having a connection terminal surface on one side and a chip mounting surface on another side, the interposer substrate including a power layer as an inner layer;
a plurality of connection terminals provided on the connection terminal surface; and
a semiconductor chip mounted on the chip mounting surface,
wherein the plurality of connection terminals include power terminals through which power is supplied from at least two kinds of power supplies, ground terminals, and signal terminals,
wherein the power terminals are connected to power patterns composed of at least two areas on the power layer and the semiconductor chip via power through holes,
wherein the ground terminals are connected to the semiconductor chip via ground through holes,
wherein the signal terminals are connected to the semiconductor chip via signal through holes,
wherein the power, ground, and signal through holes go through the interposer substrate from the connection terminal surface to the chip mounting surface,
wherein the ground and signal through holes are not formed in the respective power patterns on the power layer, and
wherein the respective power patterns define areas that surround only the respective power through holes.

6. The semiconductor apparatus according to claim 5, wherein a ground layer is further provided as an inner layer of the interposer substrate, the ground terminals are connected to a ground pattern provided on the ground layer and the semiconductor chip via the ground through holes, and the ground pattern defines an area that surrounds only the ground through holes.

7. The semiconductor apparatus according to claim 6, wherein the ground pattern is arranged so as to be adjacent to all the power patterns.

8. The semiconductor apparatus according to claim 5, wherein the at least two kinds of power supplies have different voltages.

* * * * *